United States Patent
Sharma et al.

(10) Patent No.: US 10,872,660 B2
(45) Date of Patent: Dec. 22, 2020

(54) RESISTIVE MEMORY DEVICES WITH TRANSITION METAL DICHALCOGENIDE (TMD) MATERIALS AS BALLAST RESISTORS TO CONTROL CURRENT FLOW THROUGH THE DEVICES

(71) Applicant: Intel Corporation, Santa Clara, CA (US)

(72) Inventors: Abhishek A. Sharma, Hillsboro, OR (US); Ravi Pillarisetty, Portland, OR (US); Van H. Le, Beaverton, OR (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/465,967

(22) PCT Filed: Dec. 30, 2016

(86) PCT No.: PCT/US2016/069615
§ 371 (c)(1),
(2) Date: May 31, 2019

(87) PCT Pub. No.: WO2018/125237
PCT Pub. Date: Jul. 5, 2018

(65) Prior Publication Data
US 2020/0027504 A1    Jan. 23, 2020

(51) Int. Cl.
*G11C 13/00* (2006.01)
*H01L 45/00* (2006.01)

(52) U.S. Cl.
CPC .......... *G11C 13/0007* (2013.01); *H01L 45/08* (2013.01); *H01L 45/1233* (2013.01);
(Continued)

(58) Field of Classification Search
CPC ... G11C 13/0007; H01L 45/16; H01L 45/146; H01L 45/141; H01L 45/1253;
(Continued)

(56) References Cited

U.S. PATENT DOCUMENTS

| 2013/0146829 A1 | 6/2013 | Kim et al. |
| 2013/0234094 A1 | 9/2013 | Chang et al. |

(Continued)

FOREIGN PATENT DOCUMENTS

| WO | 2016200971 | 12/2016 |

OTHER PUBLICATIONS

International Search Report and Written Opinion from PCT/US2016/069615 dated Sep. 20, 2017, 15 pgs.

*Primary Examiner* — David Lam
(74) *Attorney, Agent, or Firm* — Green, Howard & Mughal LLP (57) ABSTRACT

In one embodiment, systems, methods, and apparatus are described that can reduce the peak current through semiconductor memory devices such as RRAM devices. In one embodiment, transition metal dichalcogenide (TMD) materials can be used to in connection with both the transistors and the memory (for example, RRAM) devices. In one embodiment, two-dimensional (2D) materials, that is, materials that are on the order of a few angstroms thick can be used in connection with both the transistors and the memory (for example, RRAM) devices. In one embodiment, the TMD layer(s) and/or the 2D material(s) can act as a ballast to the RRAM device that can control the current flow through the RRAM device. In one embodiment, the systems, methods, and apparatus can serve to reduce the current as the voltage increases at a predetermined range, a property that can be referred to as negative differential resistance (NDR).

16 Claims, 6 Drawing Sheets

(52) U.S. Cl.
CPC ...... *H01L 45/1246* (2013.01); *H01L 45/1253* (2013.01); *H01L 45/141* (2013.01); *H01L 45/146* (2013.01); *H01L 45/16* (2013.01)

(58) Field of Classification Search
CPC . H01L 45/1246; H01L 45/1233; H01L 45/08; H01L 27/2436
See application file for complete search history.

(56) References Cited

U.S. PATENT DOCUMENTS

| | | | |
|---|---|---|---|
| 2013/0334633 A1* | 12/2013 | Zhou | H01L 43/10 257/421 |
| 2015/0069315 A1 | 3/2015 | Shih et al. | |
| 2016/0315255 A1* | 10/2016 | Chen | H01L 45/1266 |
| 2016/0336439 A1 | 11/2016 | Lee et al. | |
| 2016/0379901 A1* | 12/2016 | Lin | C30B 29/60 257/29 |
| 2018/0182898 A1 | 6/2018 | Moroz et al. | |

\* cited by examiner

FIG. 5

RESISTIVE MEMORY DEVICES WITH TRANSITION METAL DICHALCOGENIDE (TMD) MATERIALS AS BALLAST RESISTORS TO CONTROL CURRENT FLOW THROUGH THE DEVICES

CLAIM OF PRIORITY

This Application is a National Stage Entry of, and claims priority to, PCT Application No. PCT/US2016/069615, filed on Dec. 30, 2016 and titled "SEMICONDUCTOR MEMORY DEVICES WITH BALLASTS", which is incorporated by reference in its entirety for all purposes.

TECHNICAL FIELD

This disclosure generally relates to memory devices, and more particularly to memory devices with ballasts.

BACKGROUND

Non-volatile memories, such as Magnetic Random Access Memory (MRAM), or Resistive Random Access Memory (RRAM), may require a selector and/or driving element, for example, a driving transistor, to switch states. Such a transistor may be fabricated using front-end-of-line (FEOL) processing methods, that is, methods for the formation of transistors directly in silicon. In one embodiment, the driving transistor may have a larger device footprint than the memory device. Accordingly, the driving transistor may need to be scaled down in terms of area, for example, in order to scale down the package in which the transistor and the memory device reside.

BRIEF DESCRIPTION OF THE FIGURES

Reference will now be made to the accompanying drawings, which are not necessarily drawn to scale, and wherein.

DETAILED DESCRIPTION

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in formation a described structure.

Non-volatile memories, such as Magnetic Random Access Memory (MRAM), or Resistive Random Access Memory (RRAM), may require a selector and/or driving element, for example, a driving transistor, to switch states. Such a transistor may be fabricated using front-end-of-line (FEOL) methods and processes, that is, methods for the fabrication of the transistors in silicon. In one embodiment, the driving transistor may have a larger device footprint than the memory device. Accordingly, the driving transistor may need to be scaled down in terms of area, for example, in order to scale down the package in which the transistor and the memory device reside.

In one embodiment, systems, methods, and apparatus are described herein that can that can reduce the peak current through semiconductor memory devices such as RRAM devices. In one embodiment, transition metal dichalcogenide (TMD) materials can be used to in connection with both the transistors and the memory (for example, RRAM) devices disclosed herein. In one embodiment, two-dimensional (2D) materials, that is, materials that are on the order of a few angstroms thick can be used in connection with both the transistors and the memory (for example, RRAM) devices disclosed herein. In one embodiment, the TMD layer(s) and/or the 2D material(s) can act as a ballast to the RRAM device that can control the current flow through the RRAM device. In one embodiment, the disclosed systems, methods, and apparatus can serve to reduce the current as the voltage increases at a predetermined range, a property that can be referred to as negative differential resistance (NDR).

As mentioned, RRAM memories may require a selection element such as driving transistors, for example, in order to switch states. In another embodiment, the driving transistors can include a three terminal device; further, the driving transistors need to provide sufficient current to switch these devices. In one embodiment, the memory devices, for example, the RRAM device, can include a two terminal device. In one embodiment, the RRAM device can comprise two electrodes sandwiching an active layer and an oxide layer. In one embodiment, RRAM devices can operate by generating one or more defects in the oxide layer, which can be referred to as oxygen vacancies (oxide bond locations where the oxygen has been removed), which can subsequently charge and drift under an electric field.

In one embodiment, the RRAM device can operate when a constituent oxide layer, which is normally insulating, is made to conduct, for example, through one or more filaments or conduction paths formed after application of a sufficiently high voltage. As mentioned, the conduction path can arise from different mechanisms, including vacancy or metal defect migration. In another embodiment, once the conduction path is formed, it may be reset (broken, resulting in a high resistance state, HRS) or set (that is, re-formed, resulting in lower resistance, a LRS) by another voltage.

In one embodiment, the RRAM device comprising a two terminal device, can change its resistive state depending on the polarity and/or magnitude of an applied voltage across the two terminals. In one embodiment, the polarity and/or magnitude of an applied voltage across the two terminals can be based, for example, at least in part on the driving transistors outputted voltage. For example, as increasingly higher positive voltages are applied to the RRAM device, the current through the RRAM device may initially be start at a first, lower value (also referred herein as a linear region), and then, with increasing voltage, the RRAM device may pass through a higher current (also referred herein as an exponential region). In one embodiment, an increase in the current through a RRAM device can signify a decrease in the resistance of the RRAM device. Accordingly, the resistance of an RRAM device can first increase at the lower applied voltages (linear region), and then decrease at relatively higher applied voltages (exponential region). Further, in a relative sense, for high current passage through the RRAM device, the resistance current can be low; for low current passage through the RRAM device, the resistance current can be high.

In one embodiment, because the current flowing through the RRAM device can determine the resistance of the RRAM device, it may be desirable to control the peak current flowing through the RRAM device. In one embodiment, by lowering the peak current through the RRAM device, the power of the device can be reduced and thereby, the efficiency of the RRAM device can be improved.

In one embodiment, systems, methods, and apparatus are described that can that can reduce the peak current through the RRAM device, and can be implemented in back-end-of-line (BEOL) processing. In one embodiment, BEOL processing can refer to a portion of Integrated circuit (IC) fabrication, where individual devices (transistors, capacitors, resistors, and the like) are interconnected with wiring on a wafer. In one embodiment, the systems, methods, and apparatus disclosed herein may not necessitate modifying driving transistors to the RRAM devices, which may be implemented using FEOL processing. In one embodiment, TMD materials can be used to in connection with both the transistors and the RRAM devices disclosed herein. In one embodiment, such TMD materials can further include 2D materials, that is, materials that are on the order of a few angstroms thick. In one embodiment, 2D materials can sometimes be referred to as single layer materials, that is, crystalline materials comprising of a single layer of atoms.

One advantage of using TMD materials and/or 2D materials in RRAM devices can be that the TMD materials and/or 2D materials can be incorporated in BEOL processing for the fabrication of the RRAM devices. Accordingly, in one embodiment, a composite device comprising a driving transistor and an RRAM device fabricated using the systems, methods, and apparatus disclosed herein can have a reduced area, for example, because silicon is may not be used to make the RRAM device. Further, in one embodiment, by using the disclosed systems, methods, and apparatus, silicon proximate to the RRAM device can be freed up to be used for other applications, for example, to generate one or more logic circuits at the bottom of the RRAM device.

In one embodiment, the TMD layer(s) and/or the 2D material(s) can act as a ballast, that is, the TMD layer(s) and/or the 2D material(s) can be in series with the remaining layers of the RRAM device, that can control the current flow through the RRAM device. For example, in a composite device comprising one transistor and one RRAM device, the transistor can serve as a ballast to the RRAM device. As another example, the TMD layer(s) and/or the 2D material(s) can serve as a ballast to the RRAM device. In one embodiment, the TMD layer(s) and/or the 2D material(s) can serve as an internal ballast to the RRAM device, that is that the TMD layer(s) and/or the 2D material(s) are internal to the layers of the RRAM device.

In one embodiment, the disclosed systems, methods, and apparatus can serve to reduce the current as the voltage increases at a predetermined range, a property that can be referred to as NDR. In one embodiment, while the disclosed systems, methods, and apparatus are described primarily with reference to RRAM devices, the systems, methods, and apparatus disclosed herein can also be applied to fabricate other electronic devices, for example, including, but not limited to, oscillators, and/or gun diodes.

In one embodiment, at lower applied voltages to the RRAM device, the energy bands of the two materials in a bilayer TMD (for example, a bilayer TMD comprising molybdenum disulfide, $MoS_2$, and tungsten diselenide, $WSe_2$) used in the RRAM device, can be aligned. In one embodiment, the energy bands can refer to the range of energies that a charge carrier within a given material can possess and the ranges of energies that a charge carrier cannot possess. As such, by applying low voltage to the RRAM device, current can be passed through the RRAM device with low resistance. Beyond a first threshold, the energy bands can become misaligned, for example, because the two materials comprising the bilayer TMD may have different chemical potentials. By further increasing the voltage, the energy bands between the two layers of the bilayer TMD can become more and more misaligned. Accordingly, the current may clamp in the RRAM device, and the resistance of the RRAM device may go up.

In one embodiment, the two layers of the bilayer used in the RRAM device can include a n-type and a p-type material. For example, in one embodiment, $MoS_2$ can be an n-type material and $WSe_2$ can be a p-type material used in the bilayer of the RRAM device. In another embodiment, when the two materials are fabricated as a bilayer, a diode-like structure can be formed. Accordingly, by forming a diode-like structure, a depletion layer can be formed in the bilayer, that is, a portion of the n-type and/or the p-type layer where there are few to no charge carriers. As such, charge carriers that give rise to the current in the RRAM device may need to tunnel, that is, hop from one layer to another layer, over the depletion layer. Such a tunneling mode of conduction can be performed easily (that is, with a low energetic barrier) at lower voltage biases. But at high voltage biases, there can be a large resistance to tunneling because of the electronic band misalignment, which can be reflected in a decreased current and an increased resistance in the RRAM device.

In one embodiment, the layers of the transistor (for example, the source, drain, gate, active layer) and the layers of the RRAM device (for example, the electrodes, the oxygen exchange layer (OEL), and/or the oxide layer, and the various TMD materials (for example, the 2D materials)), can be variously deposited using physical vapor deposition (PVD), chemical vapor deposition (CVD), metalorganic chemical vapor deposition (MOCVD), and/or atomic layer deposition (ALD), and the like. In one embodiment, one or more deposition techniques, for example, PVD and/or CVD, can be followed by a sulphurization step and/or selenidization step. For example, the electrodes and/or the oxide layers of the RRAM device can be deposited, and then a sulphurization and/or selenidization step can follow using gas flow. In one embodiment, the gas flow can include any material from the oxygen group, for example, sulfur, selenium, and the like. For example, in one embodiment, a molybdenum oxide layer can be deposited followed by a gas flow in order to fabricate a molybdenum disulfide ($MoS_2$) layer for use as a ballast material.

Figure 1:
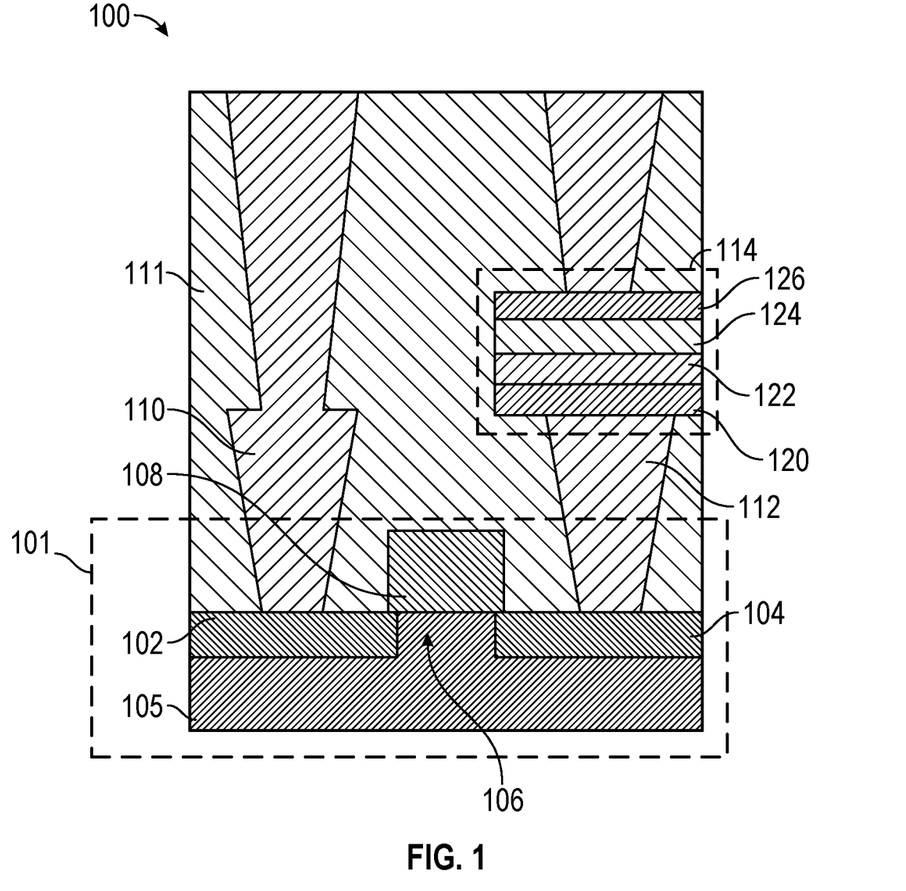
FIG. 1 shows a diagram of an example composite device comprising a driving transistor and a resistive random access memory (RRAM) device, in accordance with example embodiments of the disclosure.

FIG. 1 shows a diagram of a composite device 100 comprising a transistor 101 driving an RRAM device 114 in accordance with one or more example embodiments of the disclosure. In one embodiment, the transistor 101 can comprise a source 102, a drain 104, and an active layer 105. The transistor 101 may further include a channel 106 and a gate 108 that may also have a gate oxide, not shown.

In one embodiment, the transistor 101, can be used to drive the RRAM device. In one embodiment, a single layer or a bilayer, for example, of TMD and/or 2D material, can be used as the active layer 105 of the transistor 101 in the composite device 100. In one embodiment, the bilayer materials can include TMD materials and/or 2D material. In one embodiment, the bilayer can include a $WSe_2$ and $MoSe_2$ bilayer. In one embodiment, the active layer 105 can be doped using fluorine, nitrogen, chlorine, and/or hydrogen, and the like.

In one embodiment, the current through the composite device 100 having a single layer or a bilayer of TMD and/or 2D material as the active layer 105 of the transistor 101 can initially increase at lower voltage ranges. In another embodiment, the initial increase in the current through the composite device 100 can be due to tunneling. In another embodiment, the resistance of the composite device 100 can start low at low applied voltages, and then the resistance of the composite device 100 can increase at higher applied voltages. Accordingly, the current in the composite device 100 can decrease at the higher applied voltages.

In one embodiment, the RRAM device can be a low voltage, high current device. In another embodiment, the RRAM device 114 can be configured to operate as a high voltage, low current device. In yet another embodiment the RRAM device can be configured to operate as a low voltage, low current device. In various embodiments, low voltage, low current devices, may not be able to sustain the memory state of the RRAM device. Accordingly, high current, low voltage devices and/or low current, high voltage devices may be preferred in various applications.

As mentioned, for RRAM devices 114 configured to operate at relatively low voltages and low currents, that is, voltages and currents below a predetermined threshold, the memory state of the RRAM device 114 can be difficult to maintain. In another embodiment, for RRAM devices 114 configured to operate at relatively high voltages and low currents, that is, voltages and currents above a predetermined threshold, the driving transistor 101 can clamp the current of the composite device 100 to a predetermined value. Further, the transistor 101 may have reliability issues at higher applied voltages, for example, due to breakdown voltages causing the transistor materials to fail.

In one embodiment, the source 102 can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the source material. In one embodiment, source can include gettering materials. In one embodiment, the gettering materials can getter sulfur. In one embodiment, the source 102 can be doped, for example, by creating vacancies of sulfur and selenium. In one embodiment, the source 102 can have a thickness of approximately 0.5 nm to approximately 100 nm, with example thicknesses of approximately 0.5 nm to approximately 20 nm. In one embodiment, the source 102 can be deposited using physical vapor deposition (PVD), chemical vapor deposition (CVD), metalorganic chemical vapor deposition (MOCVD), and/or ALD.

In another embodiment, the drain 104 can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain can include gettering materials. In one embodiment, the gettering materials can getter sulfur. In one embodiment, the drain 104 can have a thickness of approximately 0.5 nm to approximately 100 nm, with example thicknesses of approximately 0.5 nm to approximately 20 nm. In one embodiment, the drain 104 can be deposited using PVD, CVD, MOCVD, and/or ALD. In one embodiment, the source 102 and drain 104 can include the same material, except that the source 104 can be treated to remove some of the sulfur and/or selenium. Accordingly, the source 104 can be doped by creating vacancies of sulfur and/or selenium.

In one embodiment, the active layer 105 can include $MoS_2$, $WSe_2$, black phosphorous, amorphous Si, germanium, carbon nanotube, and the like. In one embodiment, the active layer 105 can have a thickness of approximately 0.5 nm to approximately 100 nm, with example thicknesses of approximately 0.5 nm to approximately 20 nm. In one embodiment, the active layer 105 can be deposited using PVD, CVD, MOCVD, ALD, PVD sputtering, and/or exfoliation.

In another embodiment, the channel 106 can include substantially the same material as the active layer 105. In one embodiment, the channel width can depend on which technology was used to generate the transistor. In one embodiment, the channel width can be approximately 90 nanometers down to approximately 5 nanometers. In one embodiment, the channel 106 can be deposited using PVD, CVD, MOCVD, and/or ALD.

In one embodiment, the gate 108 can include a gate oxide (not shown) and a gate metal. In one embodiment, the gate 108 can be used in combination with a single layer and/or bilayer as the active layer 105 of the transistor 101 to produce the NDR effect in the composite device 100 including the RRAM device 114. In another embodiment, the gate metal can include a transition metal. In one embodiment, the gate metal can be used to tune the threshold voltage of the transistor 101. In one embodiment, the gate metal can include titanium nitride, cobalt, tungsten and/or platinum. In one embodiment, the gate 108 can have a thickness of approximately 0.1 nm to approximately 100 nm, with example thicknesses of approximately 0.01 nm to approximately 10 nm. In one embodiment, the a gate 108 can be deposited using PVD, CVD, MOCVD, and/or ALD.

In another embodiment, the gate oxide, not shown, can include a high-K material, for example, hafnium oxide, tantalum oxide, and/or titanium oxide, and the like. In another embodiment, the gate oxide can include silicon oxide, which may not be a high-K material. In one embodiment, an electroglass (EG) can be used as the gate oxide. In one embodiment, the gate can include a gate dielectric, for example, hydrogenated boron nitride (HBN). In one embodiment, the gate oxide can have a thickness of approximately 1 angstroms to approximately 200 angstroms, with example thicknesses of approximately 4 angstroms to approximately 20 angstroms. In one embodiment, the gate oxide can be deposited using PVD, CVD, MOCVD, and/or ALD.

In various embodiments, the transistor can be driven by one or more contacts, for example, a contact 110 that may be electrically connected to the source 102 and another contact 112 that may be electrically connected to a drain 104. In one embodiment, the contacts 110 and 112 can include a low work function metals, including hafnium, tantalum, titanium, and the like. In one embodiment, the contacts 110 and 112 can include any metal and/or semiconductor material having a low resistance and a high conductivity. In another embodiment, the contacts 110 and 112 can be deposited using PVD, CVD, MOCVD, and/or ALD.

In one embodiment, the introduction of vacancies in the TMD material can dope the TMD material. Accordingly, there may not be a high contact resistance between a doped TMD material and a metal. In one embodiment, there can be a contact resistance between silicon and the metal. In another embodiment, by doping the source regions by introducing vacancies of sulphur, selenium, and the like, a metal contact can be formed with almost any metal.

In various embodiments, the transistor 101 and the RRAM device 114 can be enclosed and/or encapsulated in an oxide 111. In one embodiment, the oxide 111 can include an interlayer dielectric (ILD) material. In another embodiment, the ILD can include silicon dioxide, $SiO_2$, or a low-K material. In one embodiment, the oxide 111 can be deposited using PVD, CVD, MOCVD, and/or ALD.

In various embodiments, the diagram 100 further includes an RRAM device 114. In an embodiment, the RRAM device 114 may be driven by the transistor 101 described previously.

In one embodiment, the RRAM device 114 can include a bottom electrode 120. In another embodiment, the bottom electrode 120 can include titanium nitride, tantalum nitrite, tungsten, ruthenium, platinum, and/or cobalt, and the like. In one embodiment, the bottom electrode 120 can include one or more inert materials. In another embodiment, the bottom electrode 120 can have a thickness of approximately 1 nm to approximately 200 nm, with example thicknesses of approximately 6 nm to approximately 20 nm. In one embodiment, the bottom electrode 120 can be deposited using PVD, CVD, MOCVD, and/or ALD.

In one embodiment, the RRAM device 114 can include an oxide layer 122. In one embodiment, the oxide layer 122 can include a hafnium oxide, tantalum oxide, and/or titanium oxide, or the like. In one embodiment, the oxide layer 122 can include a transition metal oxides. In another embodiment, the oxide layer 122 can have a thickness of approximately 1 nm to approximately 200 nm, with example thicknesses of approximately 3 nm to approximately 10 nm. In another embodiment, the oxide layer 122 can include an oxide of a metal that the oxide layer 122 is in contact with, e.g., the OEL 124 and/or bottom electrode 120. For example, if the OEL includes hafnium then the oxide layer can include hafnium oxide. In one embodiment, the oxide layer 122 can be deposited using PVD, CVD, MOCVD, and/or ALD.

In one embodiment the RRAM device 114 can include an oxygen exchange layer (OEL) 124. In another embodiment, the OEL 124 can include a conductive metal that can react with one or more oxides to form one or more suboxides. In one embodiment, the OEL 124 can comprise one or more reactive metals. In one embodiment, the OEL can include hafnium, tantalum, titanium, carbon, and/or tungsten, and the like. In one embodiment, the OEL 124 can have a thickness of approximately 1 nm to approximately 200 nm, with example thicknesses of approximately 3 nm to approximately 10 nm. In one embodiment, the OEL 124 can be deposited using PVD, CVD, MOCVD, and/or ALD.

In one embodiment, the RRAM device 114 can include a top electrode 126. In another embodiment, the top electrode 126 can include titanium nitride, tantalum nitrite, tungsten, ruthenium, platinum, and/or cobalt, and the like. In one embodiment, the top electrodes 126 can include inert materials. In one embodiment, the top electrode 126 can have a thickness of approximately 1 nm to approximately 200 nm with example thickness of approximately 6 nm to approximately 20 nm. In one embodiment, the top electrode 126 can be deposited using PVD, CVD, MOCVD, and/or ALD.

In one embodiment, the bottom electrode 120 and the top electrode 126 can be the same or can be different materials. In one embodiment, the OEL 124 can be the layer where the memory state of the RRAM device 114 can be stored. Accordingly, the electrode (for example, the top electrode 126 in the RRAM device structure shown in FIG. 1) that is in contact with the OEL 124 can be selectively chosen based on one or more features, for example, work function, reactivity, and the like. In another embodiment, the choice for top electrode 126 material may not affect device performance as much as the bottom electrode 120 material. For example, the top electrode 126 can include a titanium nitride, for example, because of the ease of etching such a titanium nitride layer.

In another embodiment, any of the RRAM layers, for example, the OEL 124, the oxide layer 122, the bottom electrode 120, and/or the top electrode 126 can be doped using fluorine, nitrogen, chlorine, and/or hydrogen, and the like.

Figure 2:
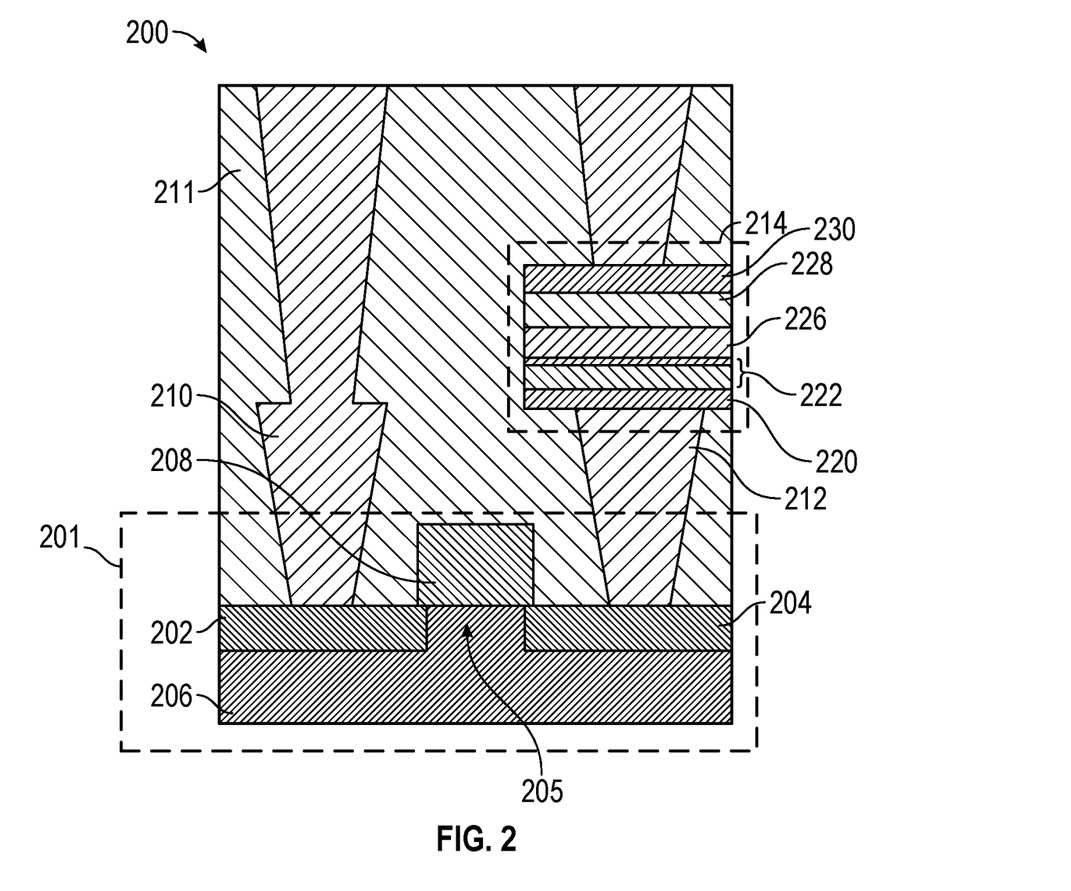
FIG. 2 shows a diagram of an example composite device comprising a driving transistor and a RRAM device including a ballast, in accordance with example embodiments of the disclosure.

FIG. 2 shows a diagram of a composite device 200 including an example transistor 201 driving an example RRAM device 214, in accordance with one or more example embodiments of the disclosure.

In one embodiment, the RRAM device 214 can include an OEL 228 and an oxide layer 226, sandwiched by two electrode, a bottom electrode 220 and a top electrode 230.

In one embodiment, the transistor 201 can include a source 202, a drain 204, an active layer 205, a channel 106, a gate 208 and a gate oxide, not shown. In various embodiments, the composite device 200 can further show an RRAM device 214.

In one embodiment, the transistor, which can be silicon-based is unchanged and can be fabricated using FEOL processing. In one embodiment, a bilayer ballast 222 can be deposited in the RRAM device 214.

In one embodiment, the bilayer materials used in the ballast 222 can include TMD materials and/or 2D materials. In one embodiment, the bilayer can include a $WSe_2$ and $MoSe_2$ bilayer. In another embodiment, the bilayer can include a graphene layer. In one embodiment, the RRAM device 214 and the bilayer used in the ballast 222 can be fabricated using BEOL processing. In one embodiment, the bilayer used in the ballast 222 can be doped using fluorine, nitrogen, chlorine, and/or hydrogen, and the like. In another embodiment, any of the RRAM layers, for example, the OEL 229, the oxide layer 226, the bottom electrode 220, and/or the top electrode 230 can be doped using fluorine, nitrogen, chlorine, and/or hydrogen, and the like.

In one embodiment, the current through the composite device 200 including the transistor 201 and RRAM device 214 including the ballast 222 can initially increase at lower voltage ranges. In another embodiment, the initial increase in the current through the device can be due to tunneling. In another embodiment, the resistance of the RRAM device 214 with the ballast 222 can starts low at low applied voltages, and then the resistance of the RRAM device 214 can increase at higher applied voltages. Accordingly, the current in the RRAM device 214 can decrease at the higher applied voltages.

In one embodiment, at relatively low voltages and low currents, the memory state of the RRAM device 214 can be difficult to maintain. In another embodiment, for relatively high voltages and low currents, the driving transistor 201 can clamp the current through the composite device 200. Further, the transistor 201 may have reliability issues at the higher applied voltage, for example, due to breakdown events in the materials comprising the transistor 201.

In one embodiment, the source 202 can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the source material. In one embodiment, source can include gettering materials. In one embodiment, the gettering materials can getter sulfur. In one embodiment, the source 202 can be doped by creating vacancies of sulfur and selenium. In one embodiment, the source 202 can have a thickness of approximately 0.5 nm to approximately 200 nm, with example thicknesses of approximately 0.5 nm to approximately 20 nm. In one embodiment, the source 202 can be deposited using PVD, CVD, MOCVD, and/or ALD.

In another embodiment, the drain 204 can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain can include gettering materials. In one embodiment, the gettering materials can getter sulfur.

In one embodiment, the drain 204 can have a thickness of approximately 0.5 nm to approximately 200 nm, with example thicknesses of approximately 0.5 nm to approximately 20 nm. In one embodiment, the drain 204 can be deposited using PVD, CVD, MOCVD, and/or ALD. In one embodiment, the source 202 and drain 204 can include the same material, except that the source 204 can be treated to remove some of the sulfur or selenium. Accordingly, the source 204 can be doped by creating vacancies of sulfur and selenium.

In one embodiment, the active layer 206 can include $MoS_2$, $WSe_2$, black phosphorous, amorphous Si, germanium, carbon nanotube, and the like. In another embodiment, the active layer 206 can include bulk silicon. In one embodiment, the active layer 206 can have a thickness of approximately 0.1 nm to approximately 100 nm, with example thicknesses of approximately 0.1 nm to approximately 20 nm. In another embodiment, for an active layer 206 comprising bulk silicon, the active layer 206 can have a thickness of approximately 0.1 mm to approximately 0.250 mm. In one embodiment, the active layer 206 can be deposited using PVD, CVD, MOCVD, and/or ALD.

In another embodiment, the channel 205 can include $MoS_2$, $WSe_2$, black phosphorous, amorphous Si, germanium, carbon nanotube, and the like. In another embodiment, the channel 205 can include bulk silicon. In one embodiment, the channel can have a width that can depend on which technology was used to generate the transistor 201. In one embodiment, the channel width can be approximately 90 nanometers down to approximately 5 nanometers. In one embodiment, the channel 205 can be deposited using PVD, CVD, MOCVD, and/or ALD.

In one embodiment, the gate 208 can include a gate oxide (not shown) and a gate metal. In another embodiment, the gate metal can include a transition metal. In one embodiment, the gate metal can be used to tune the threshold voltage of the transistor 201. In one embodiment, the gate metal can include titanium nitride, cobalt, tungsten and/or platinum. In one embodiment, the gate 208 can have a thickness of approximately 0.5 nm to approximately 200 nm, with example thicknesses of approximately 0.5 nm to approximately 20 nm. In one embodiment the gate 208 can be deposited using PVD, CVD, MOCVD, and/or ALD.

In another embodiment, the gate oxide, not shown, can include a high-K material, for example, hafnium oxide, tantalum oxide, and/or titanium oxide, and the like. In another embodiment, the gate oxide can include silicon oxide, which may not be a high-K material. In one embodiment, an electroglass (EG) can be used as the gate oxide. In one embodiment, the gate can include a gate dielectric, for example, hydrogenated boron nitride (HBN). In one embodiment, the gate oxide can have a thickness of approximately 1 angstroms to approximately 200 angstroms, with example thicknesses of approximately 4 angstroms to approximately 20 angstroms. In one embodiment, the gate oxide can be deposited using PVD, CVD, MOCVD, and/or ALD.

In various embodiments, the transistor can be driven by one or more contacts, for example, a contact 210 that may be electrically connected to the source 202 and another contact 212 that may be electrically connected to a drain 204. In one embodiment, the contacts 210 and 212 can include a low work function metals, including hafnium, tantalum, titanium, and the like. In one embodiment, the contacts 210 and 212 can include any metal and/or semiconductor material having a low resistance and a high conductivity. In another embodiment, the contacts 210 and 212 can be deposited using PVD, CVD, MOCVD, and/or ALD.

In various embodiments, the transistor 201 and the RRAM device 214 can be enclosed and/or encapsulated in an oxide 211. In one embodiment, the oxide 211 can include an interlayer dielectric (ILD) material. In another embodiment, the ILD can include silicon dioxide, $SiO_2$, or a low-K material. In one embodiment, the oxide 211 can be deposited using PVD, CVD, MOCVD, and/or ALD.

In various embodiments, the diagram 200 further includes an RRAM device 214. In an embodiment, the RRAM device 214 may be driven by the transistor 201 described previously. In one embodiment, the R-RAM device 214 can include a bottom electrode 220. In another embodiment, the bottom electrode 220 can include titanium nitride, tantalum nitrite, tungsten, ruthenium, platinum, and/or cobalt, and the like. In one embodiment, the bottom electrode 220 can include one or more inert materials. In another embodiment, the bottom electrode 220 can have a thickness of approximately 1 nm to approximately 200 nm, with example thicknesses of approximately 1 nm to approximately 20 nm. In one embodiment, the bottom electrode 220 can be deposited using PVD, CVD, MOCVD, and/or ALD.

In one embodiment, the R-RAM device 214 can include a ballast 222. In one embodiment, the ballast 222 can include a bilayer. In one embodiment, the bilayer can include TMD and/or 2D materials. In one embodiment, the ballast 222 can include a tungsten diselenide and/or a molybdenum disulfide bilayer (that is a $MoS_2$ and $WS_2$ bilayer). In another embodiment, the bilayer can include a graphene layer. In one embodiment, one or more of the layers of the bilayer comprising the ballast 222 for example, the $MoS_2$ layer and/or the $WSe_2$ layer, can be on the order one atomic lattice in thickness. Accordingly, in one embodiment, each layer of the bilayer comprising the ballast 222 can have a thickness on the order of less than a nanometer, for example, approximately 4 angstroms to approximately 20 angstroms thick. In one embodiment, the ballast 222 and/or the bilayer comprising the ballast 222 can be fabricated using PVD, CVD, ALD, MOCVD, PVD sputtering, and/or exfoliation.

In one embodiment, the introduction of vacancies, in the materials (for example, TMD and/or 2D material) comprising the ballast 222 can dope the materials comprising the ballast 222. Accordingly, there may not be a high contact resistance between a doped TMD material comprising the ballast 222 and a contact comprising metal, for example, an electrode.

In one embodiment, the RRAM device 214 can include an oxide layer 226. In another embodiment, the oxide layer 226 can include a hafnium oxide, tantalum oxide, and/or titanium oxide, or the like. In one embodiment, the oxide layer 226 can include a transition metal oxides. In another embodiment, the oxide layer 226 can have a thickness of approximately 1 nm to approximately 200 nm, with example thicknesses of approximately 3 nm to approximately 10 nm. In another embodiment, the oxide layer 226 can include an oxide of a metal that the oxide is in contact with or proximate to, for example, an oxide of the OEL 228, and/or one or more electrodes (for example, the bottom electrode 220 and/or the top electrode 230). For example, if the OEL 228 includes hafnium then the oxide layer 226 can include hafnium oxide, typically. In one embodiment, the oxide layer 226 can be deposited using PVD, CVD, MOCVD, and/or ALD.

In one embodiment, RRAM device 214 can include an OEL 228. In another embodiment, the OEL 228 can include a conductive metal that can react with one or more oxides to form one or more suboxides. In one embodiment, the OEL 228 can comprise reactive metals. In one embodiment, the OEL can include hafnium, tantalum, titanium, carbon, and/or tungsten, and the like. In one embodiment, the OEL 228 can have a thickness of approximately 1 nm to approximately 200 nm, with example thicknesses of approximately 1 nm to approximately 10 nm. In one embodiment, the OEL 228 can be deposited using PVD, CVD, MOCVD, and/or ALD.

In one embodiment, the RRAM device 214 can include a top electrode 230. In another embodiment, the top electrode 230 can include titanium nitride, tantalum nitrite, tungsten, ruthenium, platinum, and/or cobalt, and the like. In one embodiment, the top electrodes 230 can include inert materials. In one embodiment, the top electrode 230 can have a thickness of approximately 1 nm to approximately 200 nm, with example thicknesses of approximately 6 nm to approximately 20 nm. In one embodiment, the top electrode 230 can be deposited using PVD, CVD, MOCVD, and/or ALD.

In one embodiment, the transistor 201 used in the composite device 200 having the RRAM device structure 214 shown and described herein can thereby have operational characteristics similar, but not necessarily identical to, a thin film transistor. Accordingly, the transistor 201 may not need to be fabricated on or using silicon and/or FEOL processing.

In one embodiment, the ballast 222 comprising TMD layer(s) and/or the 2D material(s) can be in series with the remaining layers of the RRAM device 214; further the ballast 222 can control the current flow through the RRAM device 214. In one embodiment, the ballast 222 can serve as internal ballast to the RRAM device, meaning that the that the TMD materials and/or 2D materials comprising the ballast 222 are internal to the remaining layers (for example, layers 220, 226, 228, and/or 230) of the RRAM device 214.

In one embodiment, the disclosed systems, methods, and apparatus can serve to reduce the current through the RRAM device 214 as the voltage applied to the RRAM device 214 increases in a predetermined voltage range, exhibiting negative differential resistance (NDR). In one embodiment, while the disclosed systems, methods, and apparatus are described primarily with reference to memory devices (for example, RRAM devices 214 shown and described in connection with FIG. 2), the systems, methods, and apparatus disclosed herein can also be applied to fabricate other electronic devices, for example, including, but not limited to, an oscillator, and/or gun diodes.

In one embodiment, at lower applied voltages to the RRAM device 214, the energy bands of the two materials in a ballast 222 comprising a bilayer (for example, a bilayer comprising $MoS_2$ and $WSe_2$) used in the RRAM device 214, can be aligned. In one embodiment, the energy bands can refer to the range of energies that a charge carrier within a given material can possess and the ranges of energies that a charge carrier cannot possess. As such, by applying low voltage to the RRAM device 214, current can be passed through the RRAM device 214 with low resistance. Beyond a first threshold, the energy bands can become misaligned, for example, because the two materials in the ballast 222 comprising a bilayer used in the RRAM device 214 may have different chemical potentials. By further increasing the voltage, the energy bands between the two layers of the ballast 222 can become more and more misaligned. Accordingly, the current may clamp in the RRAM device 214, and the resistance of the RRAM device 214 may increase.

In one embodiment, the two materials in the ballast 222 comprising a bilayer (for example, a bilayer comprising $MoS_2$ and $WSe_2$) used in the RRAM device 214 can include a n-type and a p-type material. For example, in one embodiment, $MoS_2$ can be an n-type material, and $WSe_2$ can be a p-type material used in the ballast 222 of the RRAM device 214. In another embodiment, when the two materials are fabricated as a bilayer, a diode-like structure can be formed as the ballast 222. Accordingly, by forming a diode-like structure, a depletion layer can be formed in the bilayer comprising the ballast 222, that is, a depletion region comprising a portion of the n-type and/or the p-type layer where there are few to no charge carriers. As such, charge carriers that give rise to the current in the RRAM device 214 may need to tunnel, that is, hop from one layer to another layer, over the depletion layer in the ballast 222. Such a tunneling mode of conduction can be performed easily (that is, with a low energetic barrier) at lower voltage biases. But at high voltage biases, there can be a large resistance to tunneling because of the electronic band misalignment between the layers of the ballast 222, which can be reflected in a decreased current and an increased resistance in the RRAM device 214.

Figure 3:
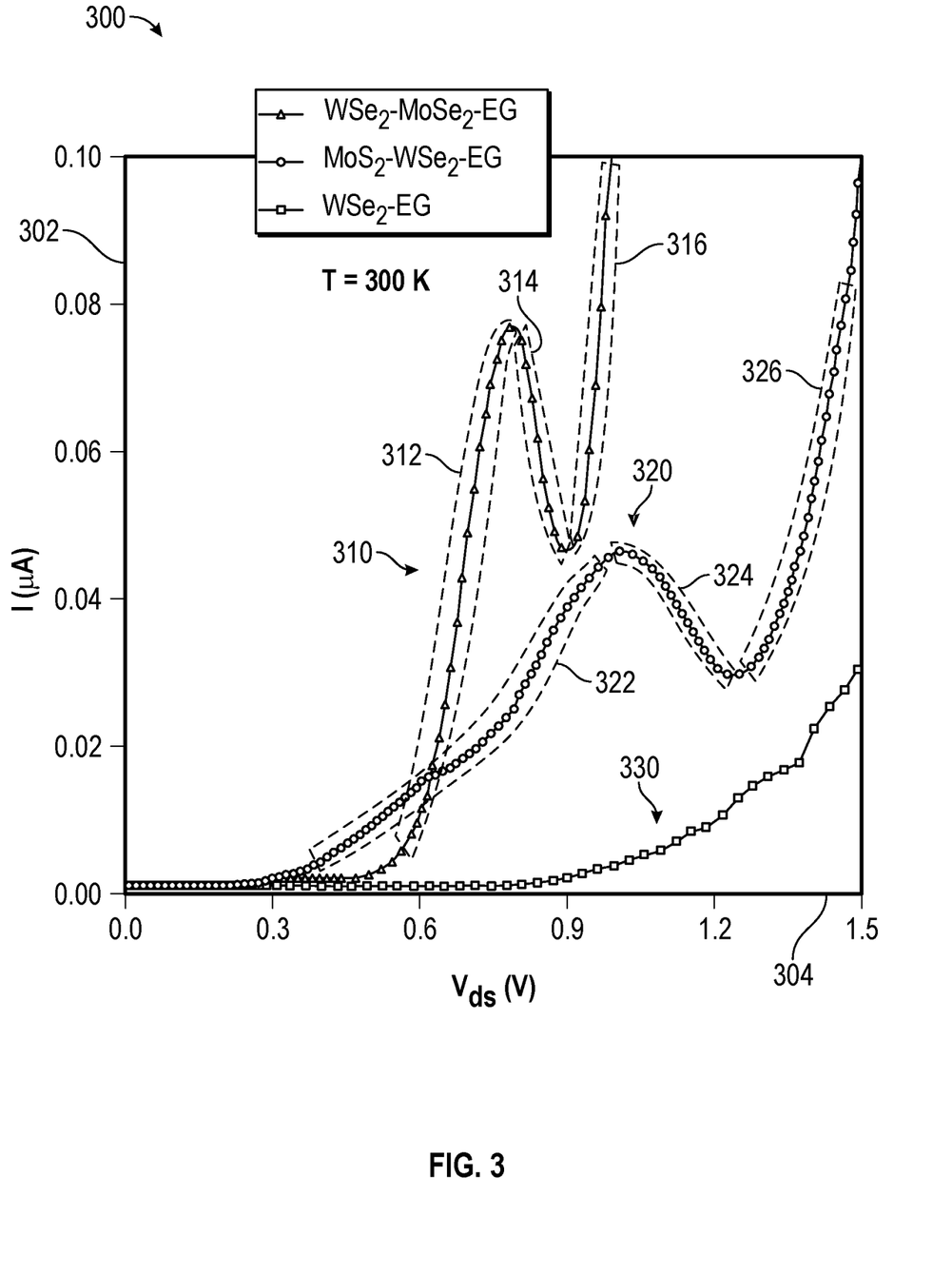
FIG. 3 shows a diagram of an example plot that represents the current voltage characteristics of a composite device comprising a driving transistor and a RRAM device including a ballast having different materials, in accordance with example embodiments of the disclosure.

In one embodiment, the operational characteristics, for example, the current-voltage characteristics of this device can be similar to that shown in FIG. 3 and relevant description.

FIG. 3 shows a diagram of an example current voltage characteristics of a composite device having a transistor driving and a RRAM device similar to the device structure as shown and described in connection with FIG. 2, in accordance with example embodiments of the disclosure.

In one embodiment, curve 310 can represent a composite device having a transistor driving an RRAM device similar to the device structure as shown and described in connection with FIG. 2, where the RRAM device further has a ballast comprising bilayer of $WSe_2$ and $MoSe_2$. Further, the transistor of the composite device has an electroglass (EG) gate dielectric. In one embodiment, curve 320 can represent a composite device having a transistor driving an RRAM device similar to the device structure as shown and described in connection with FIG. 2, where the RRAM device further has a ballast comprising bilayer of $MoS_2$ and $WSe_2$. Further, the transistor of the composite device has an electroglass gate dielectric. In one embodiment, curve 330 can represent a composite device having a transistor driving an RRAM device similar to the device structure as shown and described in connection with FIG. 2, where the RRAM device further has a ballast comprising a single layer of $WSe_2$. Further, the transistor of the composite device has an electroglass gate dielectric.

In one embodiment, as can be seen in curves 310 and 320, the current of the composite devices represented by these curves can initially increase at lower voltages (for example, voltages below approximately 0.75 volts for curve 310 and voltages below approximately 1 volt for curve 320), as represented by the areas of the curve 312 for curve 310 and 322 for curve 320. However, the current can decrease at higher voltages (for example, voltages above approximately 0.75 volts for curve 310 and voltages above approximately 1 volt for curve 320), as represented by the NDR areas of the curve 314 for curve 310 and NDR area 324 for curve 320, for example, due to the bilayer ballasts in series with the RRAM devices. As described, the current voltage characteristics for the areas of the curve 312 for curve 310 and 322 for curve 32 can be explained by tunneling. As mentioned, when the two materials are fabricated as a bilayer, a diode-like structure can be formed as the ballast. Accordingly, by forming a diode-like structure, a depletion layer can be formed in the bilayer, that is, a portion of the n-type and/or the p-type layer where there are few to no charge carriers. As such, charge carriers that give rise to the current in the RRAM device may need to tunnel, that is, hop from one layer to another layer, over the depletion layer. Such a tunneling mode of conduction can be performed easily (that is, with a low energetic barrier) at lower voltage biases. But at high voltage biases, there can be a large resistance to tunneling because of the electronic band misalignment, which can be reflected in a decreased current and an increased resistance in the RRAM device.

In one embodiment, the resistance of the ballast comprising bilayers (for example, bilayers of $WSe_2$ and $MoSe_2$ for composite devices represented by curve 310 and $MoS_2$ and $WSe_2$ for devices represented by curve 320 can be low, and therefore, the resistance of the RRAM device in such composite devices can be low.

Accordingly, the current of composite devices can initially increase at lower voltages (for example, voltages below approximately 0.75 volts for curve 310 and voltages below approximately 1 volt for curve 320). In another embodiment, when the RRAM device starts to switch (for example, at approximately 0.75 volts for curve 310 and approximately 1 volt for curve 320), the current through the device can be clamped to a lower value for further voltage increases. In one embodiment, the clamping of the current of the RRAM device can be due to the current voltage characteristics of the transistor and/or the ballast, which can also decrease.

In one embodiment, at a voltage value of approximately 0.9 V for curve 320, the resistance of the RRAM device can have a first value. At a voltage of approximately 1.2 V, the current of the device can have a second value that is lower than the first value. Accordingly, the current flowing through the device at 1.2 V may be lower than the current flowing through the device at approximately 0.9 V. Further, the resistance of the device can be higher at approximately 1.2 V than at approximately 0.9 V.

In one embodiment, overstressing an RRAM device with voltages a predetermined amount beyond the RRAM devices switching voltage, can lead to a breakdown of the RRAM device. In one embodiment, if the voltage increases beyond a predetermined threshold for a given device, the RRAM device can break down and the current may increase dramatically. In one embodiment, the current of the RRAM device may be clamped by the transistor; however, the transistor current that the RRAM device clamps to can be relatively high for the RRAM device. For example (referencing current voltage characteristics of a transistor, that is, the drain current and/or the drain voltage of the transistor), the drain current of the transistor can become flat with increasing voltage over a given voltage range when the transistor goes to a saturation mode of operation.

In one embodiment, the RRAM device having a ballast in combination with the driving transistor can, instead of clamping the current to a high value, at high voltages, lower current at high voltages can be obtained. In one embodiment, this can limit breakdown events associated with the RRAM device.

In one embodiment, curve 330 can represent a composite device having a transistor driving an RRAM device similar to the device structure as shown and described in connection with FIG. 2, where the RRAM device further has a ballast comprising a single layer of $WSe_2$. Further, the transistor of the composite device has an electroglass gate dielectric. As shown in curve 330, such a device where the RRAM device further has a ballast comprising a single layer of $WSe_2$, appears to lack a NDR region in the curve at higher voltages (for example, voltages greater approximately 1.2 V). In one embodiment, a single layer, for example, a single $MoS_2$ or a single $WSe_2$ layer, can be used for the active layer of the transistor in order to produce IV characteristics similar, but not necessarily identical to, curves 310 and 320, having an NDR region at a predetermined voltage range.

Figure 4A:
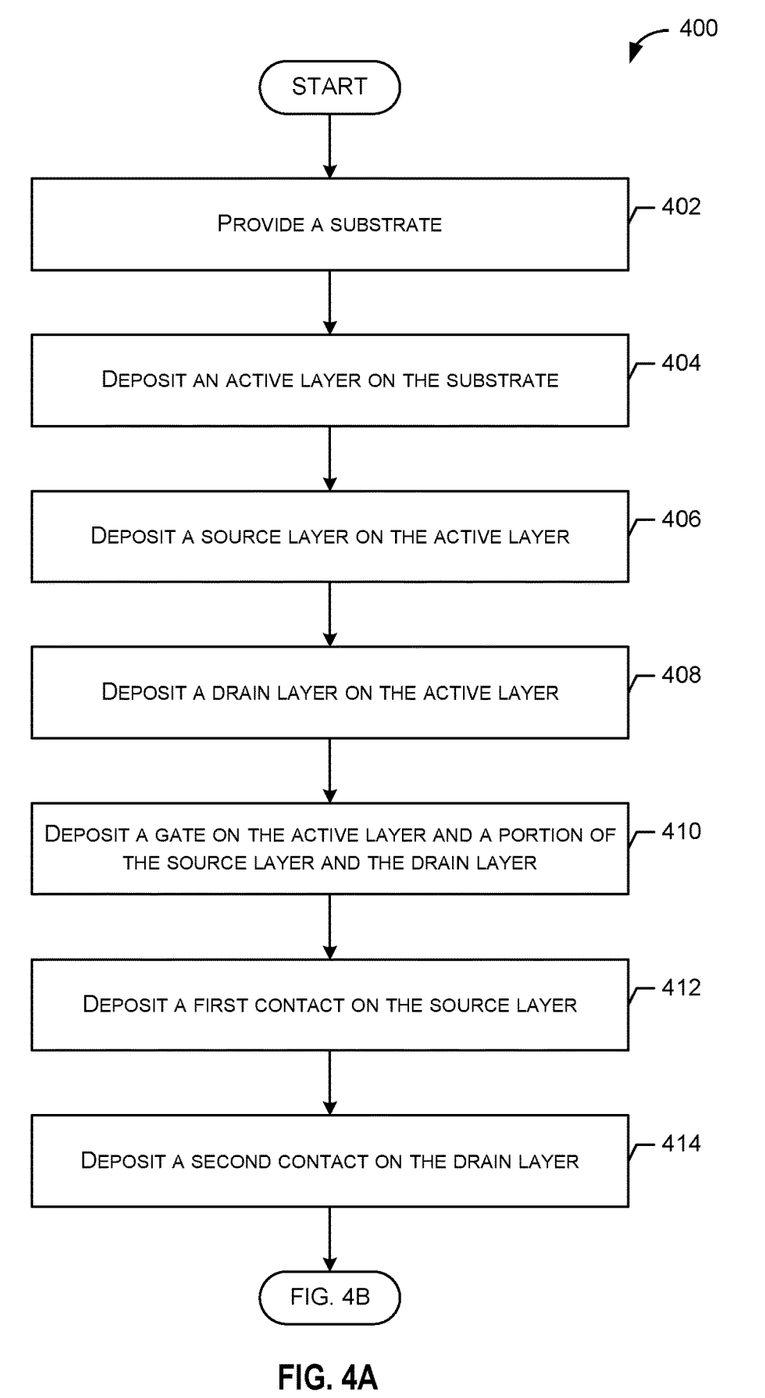
FIGS. 4A-4B show diagrams of an example flowcharts for the fabrication of the composite device comprising a driving transistor and a RRAM device including a ballast, in accordance with example embodiments of the disclosure.
Figure 4B:
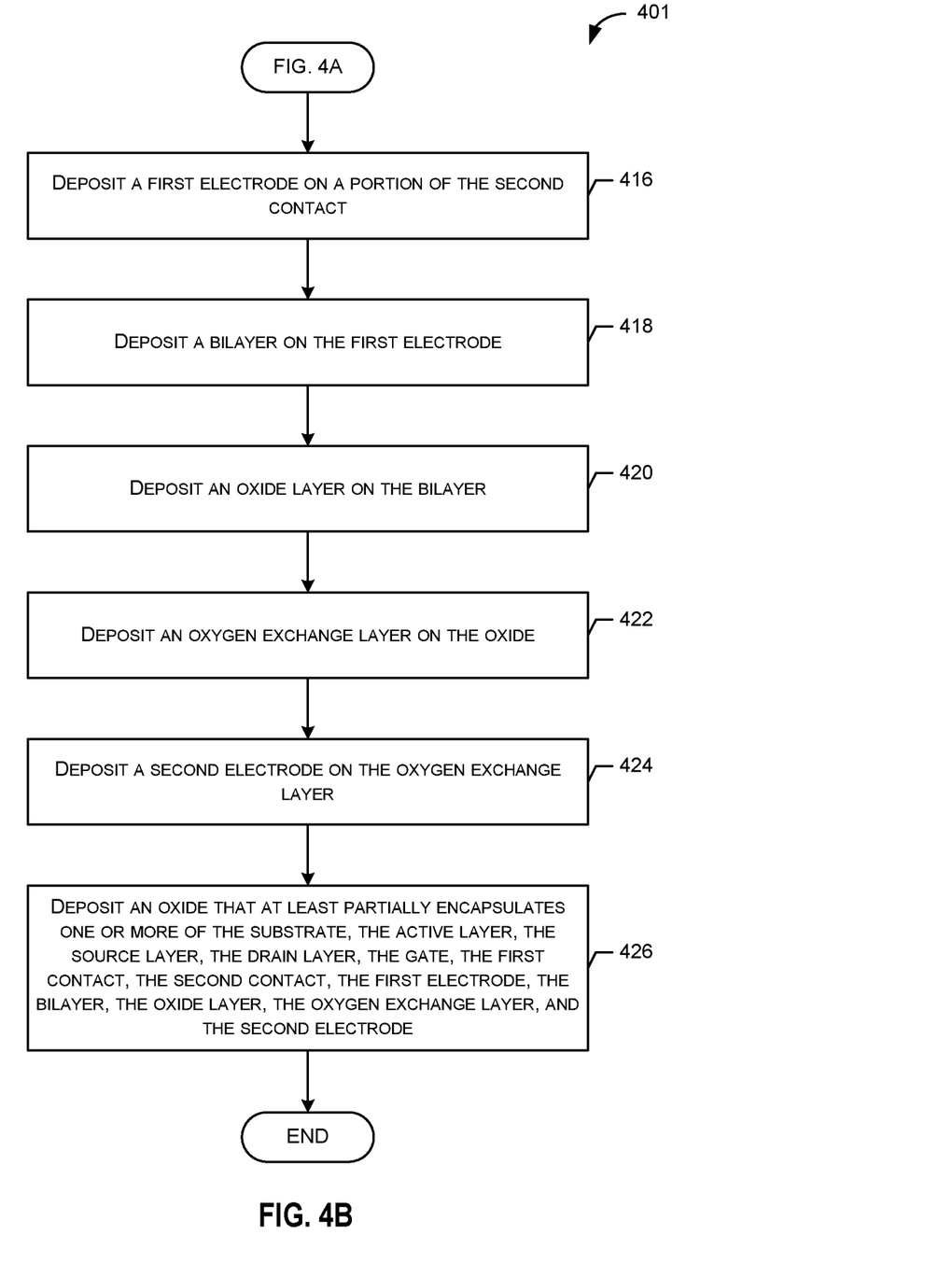

FIGS. 4A and 4B shows a diagrams 400 and 401 of example flowcharts for the fabrication of the composite device comprising a driving transistor and a RRAM device including a ballast, in accordance with example embodiments of the disclosure.

In block 402, a substrate can be provided. In one embodiment, the substrate can refer to a solid (usually planar) substance onto which a layer of another substance is applied, and to which that second substance adheres. In one embodiment, the substrate can be a thin slice of material such as silicon, silicon dioxide, aluminum oxide, sapphire, germanium, gallium arsenide (GaAs), an alloy of silicon and germanium, or indium phosphide (InP).

In block 404, an active layer for the driving transistor can be deposited on the substrate. In one embodiment, the active layer can include can include $MoS_2$, $WSe_2$, black phosphorous, amorphous Si, germanium, carbon nanotube, and the like. In one embodiment, the active layer 105 can have a thickness of approximately 0.5 nm to approximately 100 nm, with example thicknesses of approximately 0.5 nm to approximately 20 nm. In one embodiment, the active layer can be deposited using PVD, CVD, MOCVD, ALD, PVD sputtering, and/or exfoliation. In another embodiment, the active layer of the driving transistor can include a first region that can serve as the channel of the driving transistor. In one embodiment, the channel width of the transistor can depend on the type of technology used to fabricate the transistor (for example, the type of lithography and/or masking used to fabricate the transistor). In one embodiment, the channel width can be approximately 90 nanometers down to approximately 5 nanometers.

In block 406, a source layer can be deposited on the active layer. In one embodiment, the source can include In one embodiment, the source can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the source material. In one embodiment, source can include gettering materials. In one embodiment, the gettering materials can getter sulfur. In one embodiment, the source can have a thickness of approximately 0.5 nm to approximately 200 nm, with example thicknesses of approximately 0.5 nm to approximately 20 nm. In one embodiment, the source can be deposited using PVD, CVD, MOCVD, and/or ALD.

In block 408, a drain layer can be deposited on the active layer. In another embodiment, the drain can include doped or undoped $MoS_2$, $WSe_2$, black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain can include gettering materials. In one embodiment, the gettering materials can getter sulfur. In one embodiment, the drain can have a thickness of approximately 0.5 nm to approximately 200 nm, with example thicknesses of approximately 0.5 nm to approximately 20 nm. In one embodiment, the drain can be deposited using PVD, CVD, MOCVD, and/or ALD. In one embodiment, the source and/or drain can include the same material, except that the source can be treated to remove some of the sulfur or selenium. Accordingly, the source can be doped by creating vacancies of sulfur and selenium.

In block 410, a gate can be deposited on the active layer and a portion of the source layer and the drain layer. In one embodiment, the gate can include a gate oxide and a gate metal. In one embodiment, the gate can be used in combination with a single layer and/or bilayer transistor material as the active layer to produce the NDR effect in the RRAM device. In another embodiment, the gate metal can include a transition metal. In one embodiment, the gate metal can be used in order to tune the threshold voltage of the transistor. In one embodiment, the gate metal can include titanium nitride, cobalt, tungsten and/or platinum. In one embodiment, the gate can have a thickness of approximately 0.1 nm to approximately 100 nm, with example thicknesses of approximately 0.1 nm to approximately 10 nm. In one embodiment, a gate can be deposited using PVD, CVD, MOCVD, and/or ALD.

In another embodiment, the gate oxide can include a high-K material, for example, hafnium oxide, tantalum oxide, and/or titanium oxide, and the like. In another embodiment, the gate oxide can include silicon oxide. In one embodiment, an electroglass (EG) can be used as a gate oxide in the device. In one embodiment, the gate can include a gate dielectric, for example, hydrogenated boron nitride (HBN). In one embodiment, the gate oxide can have a thickness of approximately 4 angstroms to approximately 20 angstroms, with example thicknesses of approximately 2 nm to approximately 10 nm. In one embodiment, the a gate oxide can be deposited using PVD, CVD, MOCVD, and/or ALD.

In block 412, a first contact can be deposited on the source layer. In one embodiment, the contacts and can include a low work function metals, including hafnium, tantalum, titanium, and the like. In one embodiment, the contact can include any metal and/or semiconductor material having a low resistance and a high conductivity. In another embodiment, the contact and can be deposited using PVD, CVD, MOCVD, and/or ALD.

In block 414, a second contact can be deposited on the drain layer. In one embodiment, the contact can include a low work function metals, including hafnium, tantalum, titanium, and the like. In one embodiment, the contact can include any metal and/or semiconductor material having a low resistance and a high conductivity. In another embodiment, the contact can be deposited using PVD, CVD, MOCVD, and/or ALD.

In block 416, a first electrode can be deposited on a portion of the second contact. In another embodiment, the first electrode can include titanium nitride, tantalum nitrite, tungsten, ruthenium, platinum, and/or cobalt, and the like. In one embodiment, the first electrode can include one or more inert materials. In another embodiment, the first electrode can have a thickness of approximately 1 nm to approximately 200 nm, with example thicknesses of approximately 6 nm to approximately 20 nm. In one embodiment, the first electrode 220 be deposited using PVD, CVD, MOCVD, and/or ALD.

In block 418, a bilayer can be deposited on the first electrode. In one embodiment, depositing the bilayer comprises depositing a first layer and a second layer, the first layer or the second layer having a thickness of about three angstroms. In one embodiment, the bilayer can include one or more TMD layer(s) and/or 2D layers and materials. In one embodiment, the one or more TMD layer(s) and/or 2D layers and materials can include a tungsten diselenide ($WS_2$) layer, and/or a molybdenum disulfide ($MoS_2$) layer. In another embodiment, the bilayer can include a graphene layer.

In one embodiment, a single layer of the bilayer, for example, the $MoS_2$ and/or the $WSe_2$, can be on the order one atomic lattice in thickness. Accordingly, in one embodiment, a single layer of the bilayer can have a thickness on the order of less than a nanometer, for example, approximately 4 angstroms to approximately 20 angstroms thick.

In one embodiment, the introduction of vacancies, in the TMD materials and/or 2D materials of the bilayer can dope the TMD materials and/or 2D materials. Accordingly, there may not be a high contact resistance between a doped TMD materials and/or 2D materials and a metal, for example, a metal of the electrode.

In block 420, an oxide layer can be deposited on the bilayer. In another embodiment, the oxide layer can include a hafnium oxide, tantalum oxide, and/or titanium oxide, or the like. In one embodiment, the oxide layer can include a transition metal oxides. In another embodiment, the oxide layer can have a thickness of approximately 1 nm to approximately 100 nm, with example thicknesses of approximately 3 nm to approximately 10 nm. In another embodiment, the oxide layer can include an oxide of a metal that the oxide is in contact with, e.g., an OEL layer and/or one or more electrodes. In one embodiment, the oxide layer can be deposited using PVD, CVD, MOCVD, and/or ALD.

In block 422, an OEL can be deposited on the oxide. In another embodiment, the OEL can include a conductive metal that can react with one or more oxides to form one or more suboxides. In one embodiment, the OEL can comprise reactive metals. In one embodiment, the OEL can include hafnium, tantalum, titanium, carbon, and/or tungsten, and the like. In one embodiment, the OEL can have a thickness of approximately 1 nm to approximately 100 nm, with example thicknesses of approximately 3 nm to approximately 10 nm. In one embodiment, the OEL can be deposited using PVD, CVD, MOCVD, and/or ALD.

In block 424, a second electrode can be deposited on the OEL. In another embodiment, the second electrode can include titanium nitride, tantalum nitrite, tungsten, ruthenium, platinum, and/or cobalt, and the like. In one embodiment, the second electrodes can include inert materials. In one embodiment, the second electrode can have a thickness of approximately 6 nm to approximately 20 nm. In one embodiment, the second electrode can be deposited using PVD, CVD, MOCVD, and/or ALD.

In block 426, an oxide can be deposited that at least partially encapsulates one or more of the substrate, the active layer, the source layer, the drain layer, the gate, the first contact, the second contact, the first electrode, the bilayer, the oxide layer, the OEL, and the second electrode. In one embodiment, the oxide can include an interlayer dielectric (ILD) material. In another embodiment, the ILD can include SiO$_2$ or a low-K material. In one embodiment, the oxide can be deposited using PVD, CVD, MOCVD, and/or ALD.

In various embodiments, the various layers of the composite device described herein may be formed by any suitable mechanism including, but not limited to, metal foil lamination, physical vapor deposition (PVD), chemical vapor deposition (CVD), metalorganic chemical vapor deposition (MOCVD), atomic layer deposition (ALD), sputtering, metal paste deposition, combinations thereof, or the like.

Figure 5:
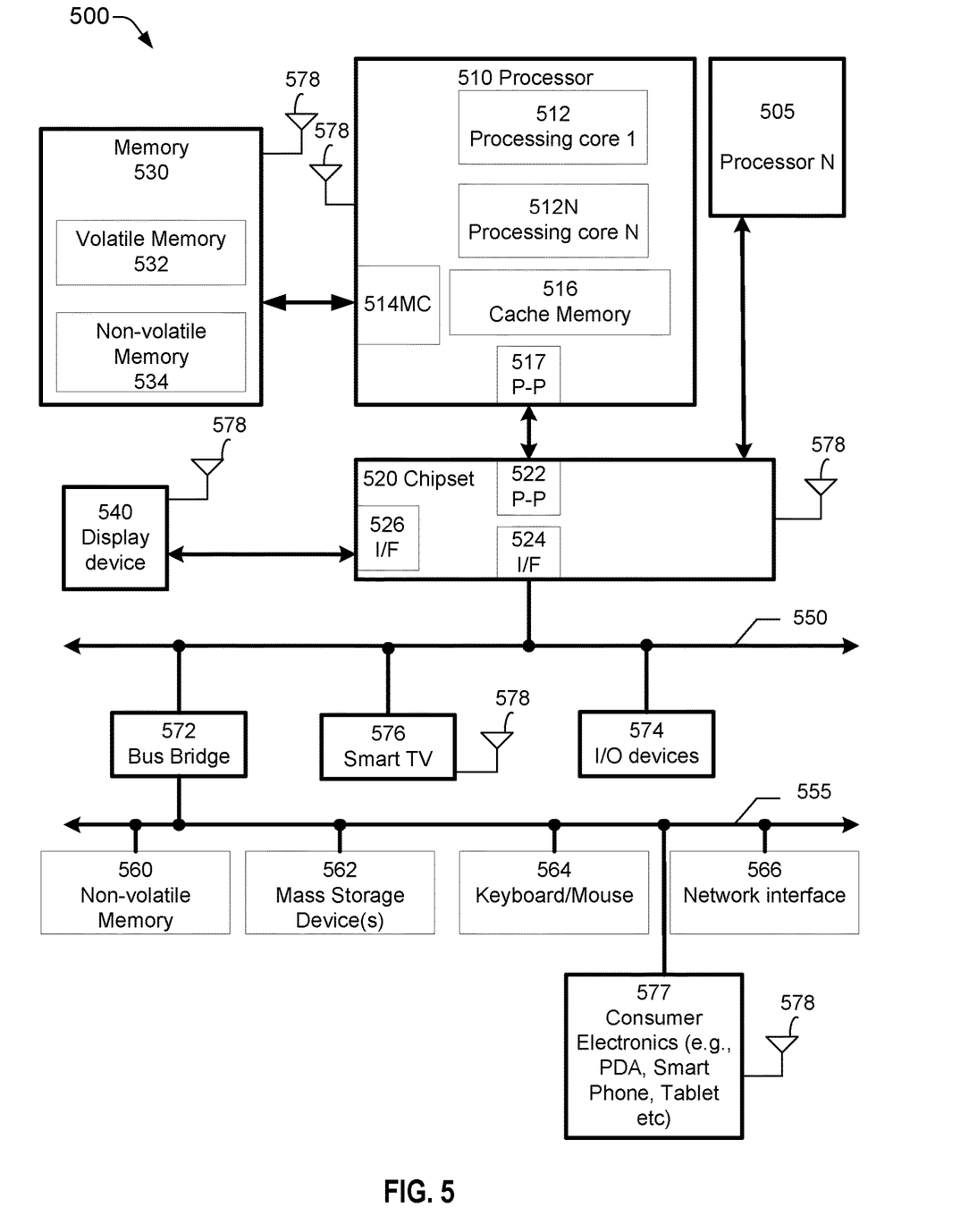
FIG. 5 shows a system level diagram, in accordance with example embodiments of the disclosure.

FIG. 5 depicts an example of a system 500 according to one or more embodiments of the disclosure. In one embodiment, the systems, methods, and apparatus disclosed herein, including for example, the composite devices including a driving transistor and an RRAM device described herein can be used in connection with system 500. For example, the composite devices including a driving transistor and an RRAM device described herein can be used in connection with system 500 to improve the performance of system 500 or to provide memory capabilities to one or more devices of system 500. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 can include a system on a chip (SOC) system.

In one embodiment, system 500 includes multiple processors including processor 510 and processor N 505, where processor N 505 has logic similar or identical to the logic of processor 510. In one embodiment, processor 510 has one or more processing cores (represented here by processing core 1 512 and processing core N 512N, where 512N represents the Nth processor core inside processor 510, where N is a positive integer). More processing cores can be present (but not depicted in the diagram of FIG. 5). In some embodiments, processing core 512 includes, but is not limited to, pre-fetch logic to fetch instructions, decode logic to decode the instructions, execution logic to execute instructions, a combination thereof, or the like. In some embodiments, processor 510 has a cache memory 516 to cache instructions and/or data for system 500. Cache memory 516 may be organized into a hierarchical structure including one or more levels of cache memory.

In some embodiments, processor 510 includes a memory controller (MC) 514, which is configured to perform functions that enable the processor 510 to access and communicate with memory 530 that includes a volatile memory 532 and/or a non-volatile memory 534. In some embodiments, processor 510 can be coupled with memory 530 and chipset 520. Processor 510 may also be coupled to a wireless antenna 578 to communicate with any device configured to transmit and/or receive wireless signals. In one embodiment, the wireless antenna 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory device 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interface 517 and P-P interface 522. Chipset 520 enables processor 510 to connect to other elements in system 500. In some embodiments of the disclosure, P-P interface 517 and P-P interface 522 can operate in accordance with a PtP communication protocol, such as the Intel® QuickPath Interconnect (QPI) or the like. In other embodiments, a different interconnect may be used.

In some embodiments, chipset 520 can be configured to communicate with processor 510, the processor N 505, display device 540, and other devices 572, 576, 574, 560, 562, 564, 566, 577, etc. Chipset 520 may also be coupled to the wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the disclosure, processor 510 and chipset 520 are integrated into a single SOC. In addition, chipset 520 connects to bus 550 and/or bus 555 that interconnect various elements 574, 560, 562, 564, and 566. Bus 550 and bus 555 may be interconnected via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device(s) 552 can include, but not be limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 or selected elements thereof can be incorporated into processor core 512.

It is noted that the system 500 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-5), as disclosed herein, may be provided in any variety of electronic device including consumer, industrial, military, communications, infrastructural, and/or other electronic devices. |In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

According to example embodiments of the disclosure, there may be a system (example 1). The system may comprise: a transistor including an active layer, a source layer, a drain layer, a gate layer, and contacts; and a RRAM device including a first electrode, a bilayer, an oxide layer, an oxygen exchange layer, and a second electrode, wherein the RRAM device is electrically coupled to the transistor, and wherein the bilayer comprises a first layer and a second layer, the first layer or the second layer having a thickness of about seven angstroms.

Implementation may include one or more of the following features (example 2). The first layer or the second layer may comprise a molybdenum disulfide layer or a tungsten diselenide layer or a transition metal dichalcogenide material. The first or second layer may comprise a two-dimensional material and may comprise graphene. The gate layer of the system may comprise a gate oxide or a electroglass material. The oxygen exchange layer may comprise hafnium, tantalum, titanium, carbon, or tungsten. The oxide layer may comprise a transition metal oxide. In various embodiment, any of the aforementioned examples may be used in part or in whole in connection with any other example in any combination or subcombination.

According to example embodiments of the disclosure, there may be a system (example 3). The system may comprise: a transistor including an active layer, a source layer, a drain layer, a gate layer, and contacts; and the RRAM device including a first electrode, a bilayer, an oxide layer, an oxygen exchange layer, and a second electrode, wherein the RRAM is electrically coupled to the transistor; wherein the active layer has a thickness of about seven angstroms.

Implementation may include one or more of the following features (example 4). The active layer may further comprise a second layer, the second layer having a thickness of about seven angstroms. The first or second layer may comprise a two dimensional material. The first layer or the second layer may comprise a transition metal dichalcogenide material. The gate layer may comprise a gate oxide, the gate oxide may comprise an electroglass material. The oxygen exchange layer may comprise hafnium, tantalum, titanium, carbon, or tungsten. The oxide layer may comprise a transition metal oxide.

According to example embodiments of the disclosure, there may be a method (example 5). The method may comprise: providing a substrate; depositing an active layer on the substrate; depositing a source layer on the active layer; depositing a drain layer on the active layer; depositing a gate on the active layer and at least a portion of the source layer and at least a portion of the drain layer; depositing a first contact on the source layer; depositing a second contact on the drain layer; depositing a first electrode on a portion of the second contact; depositing a bilayer on the first electrode, wherein depositing the bilayer comprises depositing a first layer and a second layer, the first layer or the second layer having a thickness of about three angstroms; depositing an oxide layer on the bilayer; depositing an oxygen exchange layer on the oxide; depositing a second electrode on the oxygen exchange layer; and depositing an oxide that at least partially encapsulates one or more of the substrate, the active layer, the source layer, the drain layer, the gate, the first contact, the second contact, the first electrode, the bilayer, the oxide layer, the oxygen exchange layer, and the second electrode.

Implementation may include one or more of the following features (example 6). The method of depositing the bilayer may further comprise depositing a molybdenum disulfide layer or depositing a tungsten diselenide layer. The method of depositing the bilayer may further comprise depositing a transition metal dichalcogenide material. Depositing the first or second layer may comprise depositing a two dimensional material. The method of depositing the gate layer may further comprise depositing a gate oxide. Depositing the gate oxide may further comprise depositing an electroglass material. The method of depositing the oxygen exchange layer may further comprise depositing hafnium, tantalum, titanium, carbon, or tungsten. The method of depositing the oxide layer may further comprise depositing a transition metal oxide. In various embodiment, any of the aforementioned examples may be used in part or in whole in connection with any other example in any combination or subcombination.

According to example embodiments of the disclosure, there may be an electronic device (example 1). The electronic device may comprise: a system which may comprise: a transistor including an active layer, a source layer, a drain layer, a gate layer, and contacts; and a RRAM device including a first electrode, a bilayer, an oxide layer, an oxygen exchange layer, and a second electrode, wherein the RRAM device is electrically coupled to the transistor, and wherein the bilayer comprises a first layer and a second layer, the first layer or the second layer having a thickness of about seven angstroms.

Implementation may include one or more of the following features (example 7). The first layer or the second layer may comprise a molybdenum disulfide layer or a tungsten diselenide layer or a transition metal dichalcogenide material. The first or second layer may comprise a two-dimensional material and may comprise graphene. The gate layer of the electronic device may comprise a gate oxide or a electroglass material. The oxygen exchange layer may comprise hafnium, tantalum, titanium, carbon, or tungsten. The oxide layer may comprise a transition metal oxide. In various embodiment, any of the aforementioned examples may be used in part or in whole in connection with any other example in any combination or subcombination.

According to example embodiments of the disclosure, there may be an electronic device (example 8). The electronic device may comprise: a system, comprising: a transistor including an active layer, a source layer, a drain layer, a gate layer, and contacts; and the RRAM device including a first electrode, a bilayer, an oxide layer, an oxygen exchange layer, and a second electrode, wherein the RRAM is electrically coupled to the transistor; wherein the active layer has a thickness of about seven angstroms.

Implementation may include one or more of the following features (example 9). The active layer may further comprise a second layer, the second layer having a thickness of about seven angstroms. The first or second layer may comprise a two dimensional material. The first layer or the second layer may comprise a transition metal dichalcogenide material. The gate layer may comprise a gate oxide, the gate oxide may comprise an electroglass material. The oxygen exchange layer may comprise hafnium, tantalum, titanium, carbon, or tungsten. The oxide layer may comprise a transition metal oxide. In various embodiment, any of the aforementioned examples may be used in part or in whole in connection with any other example in any combination or subcombination.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A resistive memory device structure, comprising:
a switchable resistor comprising an oxide layer and an oxygen exchange layer between a pair of electrodes;
a transistor coupled to the switchable resistor, the transistor comprising a gate and a channel between a source and a drain; and
a ballast resistor in electrical series with the switchable resistor and the transistor source or drain, wherein the ballast resistor comprises a first material layer in contact with a second material layer, a thickness of the first material layer between the second material layer and the transistor source or drain, and a thickness of the second material layer between the first material layer and one of the electrodes, and wherein the first material layer comprises a first metal chalcogenide, and the second material layer comprises a second metal chalcogenide, different than the first metal chalcogenide.

2. The resistive memory device structure of claim 1, wherein the first metal chalcogenide comprises a first of Mo or W.

3. The resistive memory device structure of claim 2, wherein the second metal chalcogenide comprises a second of Mo or W.

4. The resistive memory device structure of claim 1, wherein the first metal chalcogenide comprises a different chalcogen than the second metal chalcogenide.

5. The resistive memory device structure of claim 4, wherein the first metal chalcogenide comprises a first of S or Se, and wherein the second metal chalcogenide comprises a second of S or Se.

6. The resistive memory device structure of claim 1, wherein the first material and the second material are of complementary conductivity type.

7. The resistive memory device structure of claim 1, wherein the first material comprises Mo and S, and the second material comprises W and Se.

8. The resistive memory device structure of claim 1, wherein the first and second material layers are between the one of the oxide layer or the oxygen exchange layer and one of the first or second electrodes.

9. The device of claim 1, wherein the channel comprises a first metal chalcogenide, and the source or drain comprises a second metal chalcogenide.

10. The system of claim 1, wherein the oxygen exchange layer comprises hafnium, tantalum, titanium, carbon, or tungsten.

11. The system of claim 1, wherein the oxide layer comprises a transition metal oxide.

12. A system, comprising:
a transistor structure comprising a channel, a source, a drain, and a gate; and
a resistive memory structure coupled to the transistor source or drain, the resistive memory structure including a pair of electrodes with an oxide layer and an oxygen exchange layer therebetween,
wherein the resistive memory structure further comprises a ballast resistor stack between the pair of electrodes, ballast resistor stack comprising first metal chalcogenide layer in contact with a second metal chalcogenide layer, wherein a thickness of the first metal chalcogenide is between one of the oxide layer or the oxygen exchange layer and one of the electrodes, and wherein a thickness of the second metal chalcogenide is between the first metal chalcogenide layer and the one of the oxide layer or the oxygen exchange layer.

13. The system of claim 12, wherein the ballast resistor stack displays negative differential resistance (NDR).

14. The system of claim 12, wherein the first metal chalcogenide has a first conductivity type and the second metal chalcogenide has a second, complementary, conductivity type.

15. The system of claim 12, wherein the first metal chalcogenide comprises a first of W and Mo, and a first of S and S, and the second metal chalcogenide comprises a second of W and Mo, and a second of S and Se.

16. The system of claim 1, wherein the first metal chalcogenide has a first conductivity type and the second metal chalcogenide has a second, complementary, conductivity type.

* * * * *